United States Patent
Watt et al.

(10) Patent No.: US 6,833,330 B1
(45) Date of Patent: Dec. 21, 2004

(54) METHOD TO ELIMINATE INVERSE NARROW WIDTH EFFECT IN SMALL GEOMETRY MOS TRANSISTORS

(75) Inventors: Jeffrey T. Watt, Palo Alto, CA (US); Kedar Patel, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/739,674

(22) Filed: Dec. 18, 2003

Related U.S. Application Data

(62) Division of application No. 09/929,829, filed on Aug. 13, 2001, now Pat. No. 6,667,224.

(51) Int. Cl.⁷ .................. H01L 21/31; H01L 21/469
(52) U.S. Cl. ........................ 438/773; 438/431
(58) Field of Search ................. 438/773, 424, 438/431, 439, 475, 513, 514, 524, 294, 297, 680, 700, 770, 296

(56) References Cited

U.S. PATENT DOCUMENTS

| | | | |
|---|---|---|---|
| 5,360,753 A | * 11/1994 | Park et al. .................. 438/421 |
| 5,966,615 A | 10/1999 | Fazen et al. |
| 6,268,629 B1 | * 7/2001 | Noguchi ..................... 257/345 |
| 6,333,232 B1 | 12/2001 | Kunikido |
| 6,362,510 B1 | * 3/2002 | Gardner et al. ............. 257/374 |
| 6,391,739 B1 | 5/2002 | Liao |
| 6,465,866 B2 | * 10/2002 | Park et al. .................. 257/510 |
| 6,495,898 B1 | * 12/2002 | Iwamatsu et al. ........... 257/506 |
| 6,548,866 B2 | * 4/2003 | Noguchi ..................... 257/345 |

OTHER PUBLICATIONS

Encyclopedia of Chemical Technology, Kirk–Othmer, vol. 14, (1995), pp. 677–709.

Microchip Fabrication 4$^{th}$ Edition, Peter Van Zant, McGraw–Hill, 2000, pp. 491–527.

* cited by examiner

*Primary Examiner*—David Nhu
(74) *Attorney, Agent, or Firm*—Evan Law Group LLC

(57) ABSTRACT

A method of making a semiconductor structure includes sealing a gate layer by wet oxidation. The gate layer is on a substrate containing isolation regions. Semiconductor devices prepared from the semiconductor structure exhibits reduced inverse narrow width effects.

6 Claims, 4 Drawing Sheets

METHOD TO ELIMINATE INVERSE NARROW WIDTH EFFECT IN SMALL GEOMETRY MOS TRANSISTORS

CROSS REFERENCE TO RELATED APPLICATION

This application is a divisional application of application Ser. No. 09/929,829, filed Aug. 13, 2001, entitled "Method to Eliminate Inverse Narrow Width Effect in Small Geometry MOS Transistors" now U.S. Pat. No. 6,667,224.

BACKGROUND

The present invention relates to small geometry MOS semiconductor devices.

A variety of methods and structures have been used to isolate areas on semiconductor devices. One widely used isolation technique is shallow trench isolation (STI), shown in FIG. 5. The field oxide 16 in the silicon substrate 2, is continuous with a surface oxide layer 10. FIGS. 1–4 illustrate the steps used to prepare the structure shown in FIG. 5. Thermal oxidizing forms an oxide layer 10 on the silicon substrate 2, followed by depositing a silicon nitride layer 6 using low pressure chemical vapor deposition (LPCVD), to form the structure shown in FIG. 1. Next, a photoresist layer 4 is applied, and patterned using a mask. Etching of those portions of the silicon nitride, surface oxide layer and silicon substrate not covered by the photoresist layer, in a single operation, opens a trench 8, as shown in FIG. 2.

Then, the photoresist layer 4 is stripped, and the substrate is cleaned. A thin oxide layer 14 is next grown by dry oxidation of the exposed portions of the silicon substrate. An oxide layer 12 is then deposited into the trench and across the surface of the structure by chemical vapor deposition (CVD), to form the structure shown in FIG. 3. Chemical-mechanical polishing (CMP) is used to planarize the surface, leaving the oxide layer 12 only in the trench, as illustrated in FIG. 4. Finally, the silicon nitride layer is removed, to form the field oxide 16, shown in FIG. 5.

Once the isolation region has been formed, further device fabrication may take place. As shown in FIG. 6, typically the oxide layer 10 is removed, and regrown as a gate layer 11 of an oxide or another insulator, and a gate layer 30 of a conductor, such as polysilicon, is formed and patterned, creating gates over the active regions 36 of the structure. Forming an oxide on the surface of the gate layer, by dry oxidation using oxygen, then seals the gate layer. Further structures to complete the semiconductor devices may be formed from this structure; for example, forming source/drain regions in the substrate may be used to make transistors; these may be connected together through applied dielectric layers by contacts and metallization layers. These additional elements may be formed before, during, or after formation of the isolation regions and the gate layer. FIG. 7 illustrates a top view of FIG. 6, which includes contacts 38 to the active areas 36 of the substrate. The gate length 32 and channel width 34 are also shown in the FIG. 7; the gate length is the distance across the channel, under the gate layer that spans along the length of the active region, and the channel width is the distance between isolation regions.

A disadvantage of the STI technique is the inverse narrow width effect (INWE) that manifests itself as a reduction of the threshold voltage of the transistors as the transistor width decreases. Typically, INWE is significant once the width of the transistor is less than 0.25 µm. This effect has been eliminated or reduced by a variety of different approaches, for example, by adding implants into the sidewalls of the trench; adding extra implants into the channel region of the memory array transistors (a core implant); or adding an additional oxidation step to form a bird's beak structure at the edges of the active area. These methods all have the disadvantage of requiring additional process steps, increasing the cost and complexity of the process.

BRIEF SUMMARY

In a first aspect, the present invention is a method of making a semiconductor structure, comprising sealing a gate layer by wet oxidation. The gate layer is on a substrate comprising isolation regions.

In a second aspect, the present invention is a method of making a semiconductor structure, comprising simultaneously sealing a gate layer and forming a bird's beak structure at the interface of the gate layer and isolation regions. The gate layer is on a substrate comprising the isolation regions.

In a third aspect, the present invention is a method of eliminating inverse narrow width effects in a semiconductor device, comprising forming a bird's beak structure at the interface of a gate layer and isolation regions, by wet oxidation.

In a fourth aspect, the present invention is a method of making a semiconductor device, comprising making any of these semiconductor structures and forming a semiconductor device from the structures.

In a fifth aspect, the present invention is a method of making a semiconductor device, comprising forming isolation regions in a substrate, to form a structure and forming a semiconductor device from the structure. The forming of the semiconductor device does not comprise: adding implants into sidewalls of the isolation regions; adding core implants; nor adding an additional oxidation step to form a bird's beak structure at the edges of active areas. Furthermore, the semiconductor device does not exhibit inverse narrow width effects, and the semiconductor device comprises transistors having a channel width of at most 0.18 µm.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

The present invention includes forming a bird's beak structure at the interface of the isolation region and the gate layer. This negates the INWE. The bird's beak structure may be formed by using a wet oxidation, instead of a dry oxidation, to seal the gate layer. In this way, no additional processing step are required.

Figure 1:
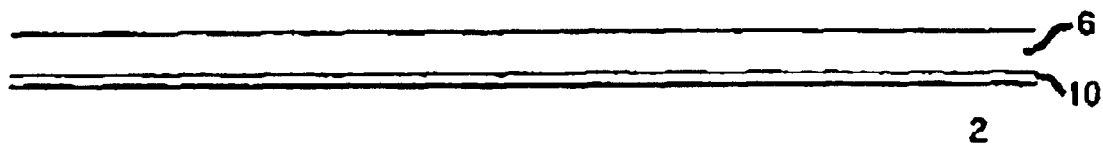
FIGS. 1–4 illustrate a series of successive edge-on views for forming the structure of FIG. 5.
Figure 2:
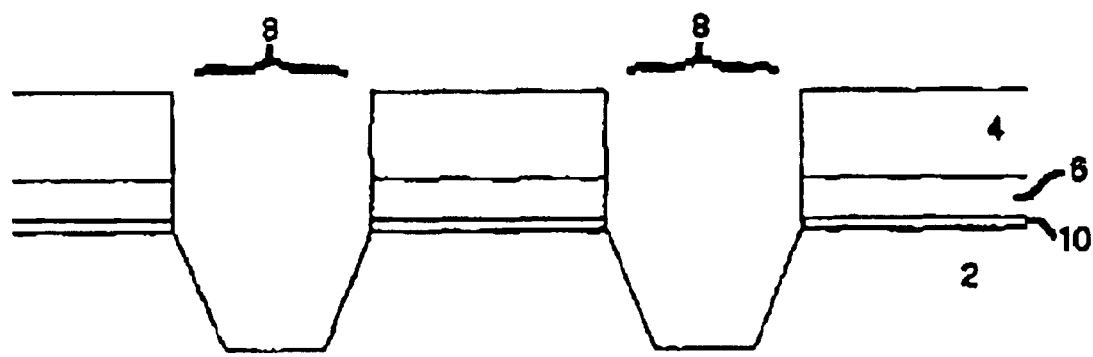
Figure 3:
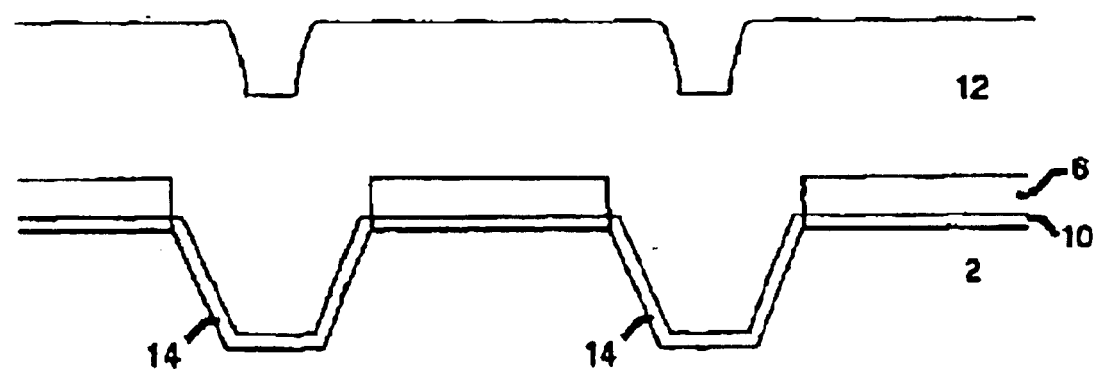
Figure 4:
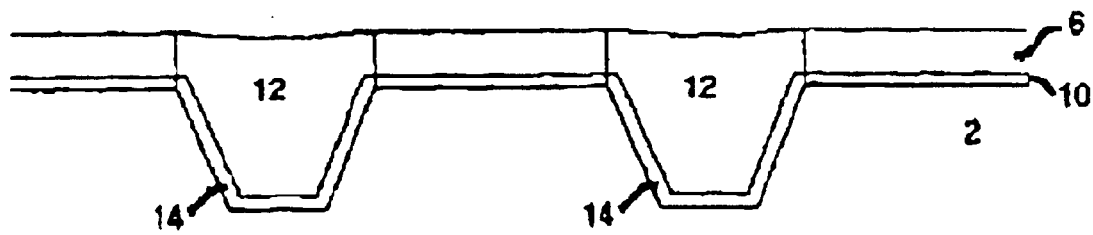
Figure 5:
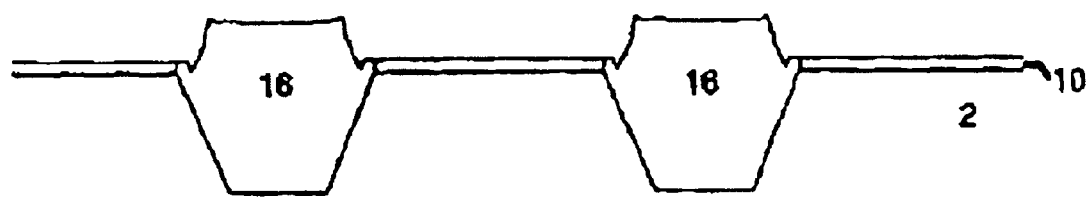
FIGS. 5 and 6 show an edge-on view of a portion of a semiconductor device containing field oxide formed by STI.
Figure 6:
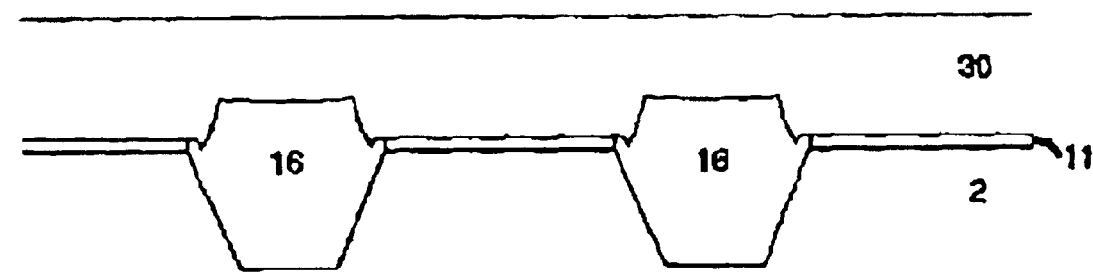
Figure 7:
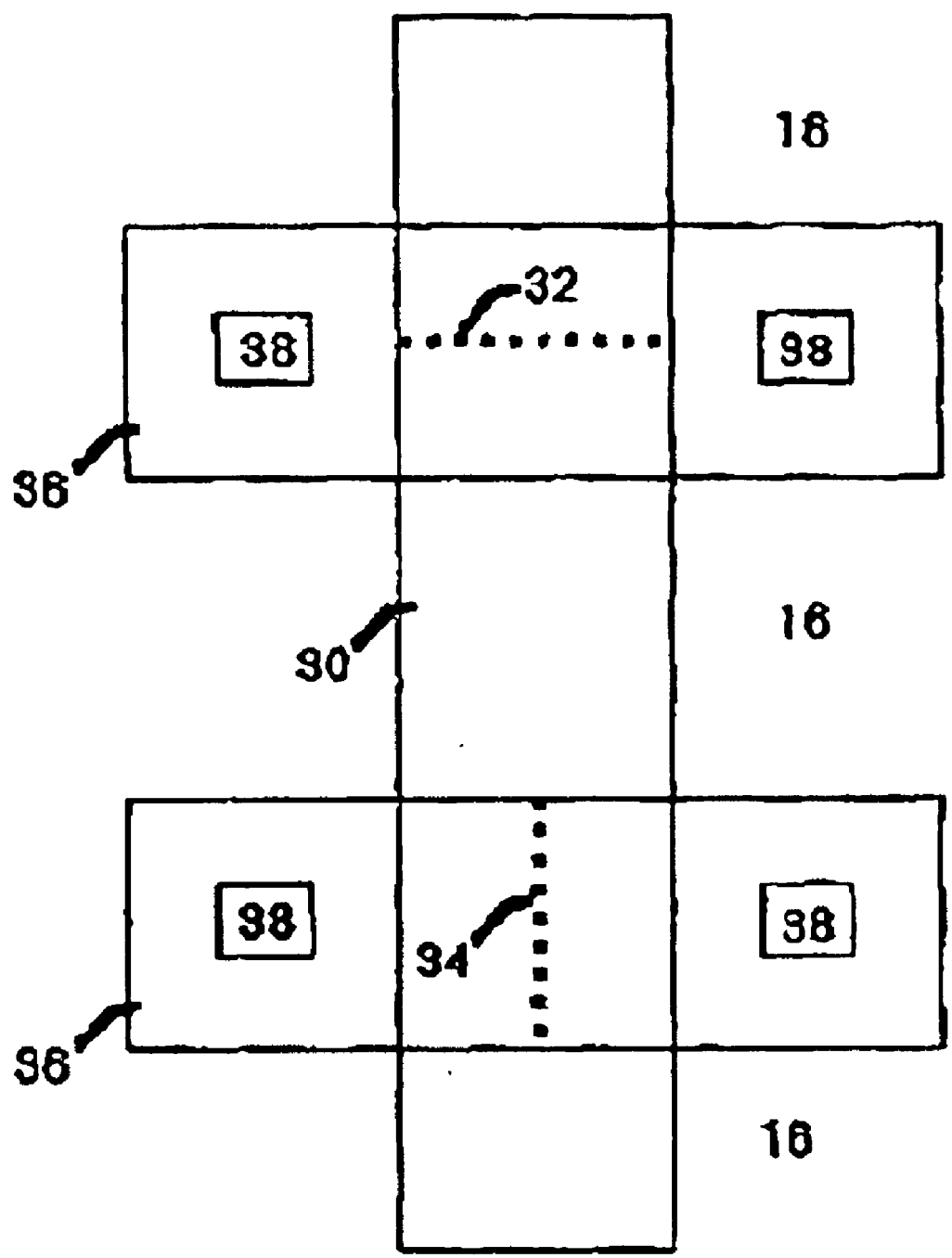
FIG. 7 shows a top view of the structure of FIG. 6.
Figure 8:
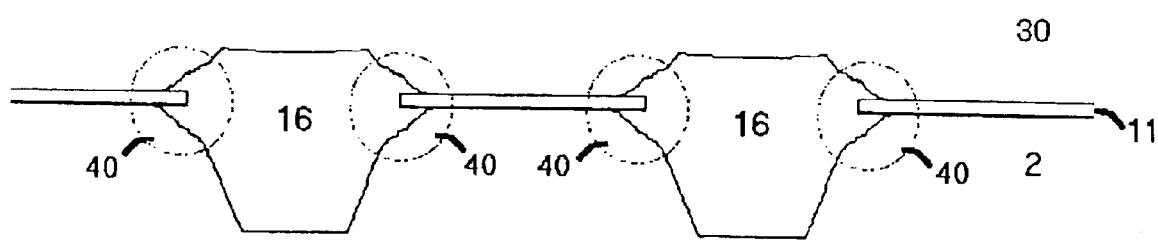
FIG. 8 shows an edge-on view of a portion of a semiconductor device containing bird's beak structures at the edges of the field oxide.

An embodiment of the present invention is illustrated in FIG. 8. This figure is the same as FIG. 6, except for the presence of bird's beak structure 40 (a dashed circle surrounds the bird's beak structures in the illustration in order to highlight this structure). A bird's beak structure is a region of insulation which is in contact with, and extends away from, the isolation region, with a gradual narrowing, and that extends farther away from the isolation region than an STI structure formed with a gate layer sealed with dry oxidation. Normally, layer 11, when made of silicon oxide, cannot be distinguished from the oxide of the isolation region 16.

The wet oxidation is oxidation with an atmosphere containing water; preferably the atmosphere during wet oxidation contains more water than any other oxygen containing gas (such as $O_2$). Preferably, the oxidation atmosphere contains a carrier gas and water; preferably the carrier gas is nitrogen and/or argon. A wet oxidation may also be carried out using a pyrogenic system, such as by introducing hydrogen gas and oxygen gas into the furnace; the hydrogen and oxygen react in the furnace to produce water.

Once the isolation region has been formed, semiconductor devices may be formed from the structure. For example, source/drain regions may be formed in the substrate, additional dielectric layers may be formed on the substrate, and contacts and metallization layers may be formed on these structures. These additional elements may be formed before, during, or after formation of the isolation regions and gate layer.

One possible explanation for the formation of the bird's beak structure during wet oxidation, as opposed to dry oxidation, is that it allows the oxidizing species to diffuse much more rapidly through the existing field oxide that fills the shallow trench isolation regions of the transistors. For short gate length transistors, such as those used in memory arrays, the oxidizing species may readily diffuse and oxidize the silicon along the entire length of the edge of the transistor channel. This oxidation may occur along the bottom and sidewalls of the trench as well as under the gate layer, creating the bird's beak structure along the transistor channel edge as shown in FIG. 8. The thicker oxide of the bird's beak structure reduces the electric field near the edges of the transistor, increasing the threshold voltage. With sufficient wet oxidation, the INWE can be completely eliminated.

Since INWE manifests primarily in structures having a channel width of less than 0.25 $\mu$m, the present invention is preferably applied to semiconductor devices containing at least one transistor having a channel width of less than 0.25 $\mu$m, more preferably having at least one transistor having a channel width of at most 0.18 $\mu$m, most preferably having a plurality of transistors having a channel width of at most 0.18 $\mu$m, such as devices having a gate critical dimension (CD) of at most 0.16 $\mu$m. Furthermore, since the present invention eliminates or reduce INWE, preferably other methods used to eliminate or reduce INWE are not included, such as adding implants into the sidewalls of the trench; adding implants into the channel region of the memory array transistors; or adding an additional oxidation step (as opposed to modifying an existing step) to form a bird's beak structure at the edges of the active area.

The individual processing steps, including etching and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 4rd. edition, Peter Van Zant, McGraw-Hill, 2000.

The substrate may typically be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}As$, where 0×1. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

The structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

EXAMPLES

Semiconductor devices were prepared by either dry oxidation, or wet oxidation, after the gate etch, under condition which produced the same thickness of oxide on a single crystal substrate. The table below shows the threshold voltages for the transistors of the semiconductor device. A core implant (an extra implant to off-set INWE) was included in the device with the smallest transistor width, in order to increase the threshold voltage and minimize the contribution to standby current from the memory cell transistors.

| Transistor width/length | Threshold voltage (V) | |
|---|---|---|
| ($\mu$m) | Dry oxidation | Wet oxidation |
| 25/25 | 0.74 | 0.73 |
| 25/0.16 | 0.74 | 0.73 |
| 0.18/0.16 | 0.81 | 1.06 |

These examples show that the wet oxidation significantly increases the threshold voltage of the cell transistors without having much effect on the wide periphery transistors. The threshold voltage increase is large enough that the core implant is not necessary to prevent INWE for the small geometry transistors formed with a wet oxidation.

Obviously, numerous modifications and variations of the present invention are possible in light of the above teachings. It is therefore to be understood that within the scope of the appended claims, the invention may be practiced otherwise than as specifically described herein.

What is claimed is:

1. A method of eliminating inverse narrow width effects in a semiconductor device, comprising forming a bird's beak structure at an interface of a gate layer and isolation regions, by wet oxidation;

wherein a channel width of the gate layer is at most 0.18 $\mu$m.

2. The method of claim 1, wherein the wet oxidation is oxidation in an atmosphere comprising a carrier gas and water.

3. The method of claim 1, where the wet oxidation is oxidation in an atmosphere prepared by introducing hydrogen and oxygen into a furnace.

4. The method of claim 1, wherein a gate critical dimension of the gate layer is at most 0.16 μm.

5. A method of making a semiconductor device, comprising:

forming isolation regions in a substrate, to form a semiconductor structure; and forming a semiconductor device from the structure;

wherein the forming of the semiconductor device does not comprise: adding implants into sidewalls of the isolation regions; adding core implants; nor adding an additional oxidation step to form a bird's beak structure at edges of active areas, and wherein the semiconductor device does not exhibit inverse narrow width effects, and the semiconductor device comprises transistors having a channel width of at most 0.18 μm.

6. A method of making an electronic device, comprising:

making a semiconductor device by the method of claim 5; and forming an electronic device, comprising said semiconductor device.

* * * * *